(12) United States Patent
Sharifi et al.

(10) Patent No.: US 10,056,340 B1
(45) Date of Patent: Aug. 21, 2018

(54) FLEXIBLE ELECTRONIC CIRCUIT AND METHOD FOR MANUFACTURING SAME

(71) Applicant: HRL Laboratories, LLC, Malibu, CA (US)

(72) Inventors: Hasan Sharifi, Agoura Hills, CA (US); Keisuke Shinohara, Thousand Oaks, CA (US); Mary C. Montes, West Hills, CA (US); Charles McGuire, Newbury Park, CA (US); Wonill Ha, Thousand Oaks, CA (US); Jason May, Marina Del Rey, CA (US); Hooman Kazemi, Thousand Oaks, CA (US); Jongchan Kang, Moorpark, CA (US); Robert G. Nagele, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 15 days.

(21) Appl. No.: 15/346,155

(22) Filed: Nov. 8, 2016

Related U.S. Application Data

(62) Division of application No. 13/906,750, filed on May 31, 2013, now Pat. No. 9,530,708.

(51) Int. Cl.
*H01L 23/00* (2006.01)
*H01L 23/66* (2006.01)
(Continued)

(52) U.S. Cl.
CPC ........ *H01L 23/66* (2013.01); *H01L 21/31111* (2013.01); *H01L 21/6836* (2013.01);
(Continued)

(58) Field of Classification Search
CPC ....................................................... H01L 23/66
See application file for complete search history.

(56) References Cited

U.S. PATENT DOCUMENTS

| | | | |
|---|---|---|---|
| 4,686,550 A | 8/1987 | Capasso et al. | |
| 4,733,283 A | 3/1988 | Kuroda | |

(Continued)

FOREIGN PATENT DOCUMENTS

| | | |
|---|---|---|
| EP | 313749 | 5/1989 |
| EP | 477580 | 4/1992 |

(Continued)

OTHER PUBLICATIONS

U.S. Appl. No. 09/338,217, filed Jun. 22, 1999, Docter et al.

(Continued)

*Primary Examiner* — William Harriston
(74) *Attorney, Agent, or Firm* — Ladas & Parry

(57) ABSTRACT

An electronic circuit comprising: an integrated circuit chip, the integrated circuit chip having a top face; portions of the top face of the chip being covered by a first metal layer electrically connected to the integrated circuit; and a dialectic layer formed on the top face of the chip beside and on top of said first metal layer; wherein the dielectric layer extends parallel to the top face of the chip beyond the edges of the chip, the first metal layer extending in the dielectric layer beyond the edges of the chip; and wherein portions of a top surface of the dielectric layer are covered by a second metal layer, portions of the first and second metal layers being electrically connected through the dielectric layer.

9 Claims, 5 Drawing Sheets

(51) Int. Cl.
  *H01L 21/683*  (2006.01)
  *H01L 21/311*  (2006.01)
  *H01L 23/12*  (2006.01)

(52) U.S. Cl.
  CPC .... *H01L 23/12* (2013.01); *H01L 2221/68345* (2013.01); *H01L 2223/6672* (2013.01)

(56) References Cited

U.S. PATENT DOCUMENTS

| | | | |
|---|---|---|---|
| 4,821,082 | A | 4/1989 | Frank et al. |
| 5,164,800 | A | 11/1992 | Nakajima |
| 5,170,407 | A | 12/1992 | Schubert et al. |
| 5,212,394 | A | 5/1993 | Iwasaki et al. |
| 5,223,449 | A | 6/1993 | Morris et al. |
| 5,349,201 | A | 9/1994 | Stanchina et al. |
| 5,365,077 | A | 11/1994 | Metzger et al. |
| 5,373,191 | A | 12/1994 | Usagawa et al. |
| 5,404,028 | A | 4/1995 | Metzger et al. |
| 5,436,468 | A | 7/1995 | Nakata et al. |
| 5,606,185 | A | 2/1997 | Nguyen et al. |
| 5,610,086 | A | 3/1997 | Liu et al. |
| 5,612,551 | A | 3/1997 | Liu et al. |
| 5,665,614 | A | 9/1997 | Hafii et al. |
| 5,705,847 | A | 1/1998 | Kashiwa et al. |
| 5,721,161 | A | 2/1998 | Nguyen et al. |
| 5,726,462 | A | 3/1998 | Spahn et al. |
| 5,753,545 | A | 5/1998 | Liu et al. |
| 5,799,026 | A | 8/1998 | Meyer et al. |
| 5,837,570 | A | 11/1998 | Asano |
| 5,851,310 | A | 12/1998 | Freundlich et al. |
| 5,949,095 | A | 9/1999 | Nagahara et al. |
| 6,031,256 | A | 2/2000 | Liu et al. |
| 6,064,082 | A | 5/2000 | Kawai et al. |
| 6,172,420 | B1 | 1/2001 | Shiralagi |
| 6,252,894 | B1 | 6/2001 | Sasanuma et al. |
| 6,258,639 | B1 | 7/2001 | Rohdin et al. |
| 6,399,971 | B1 | 6/2002 | Shigematsu et al. |
| 6,429,467 | B1 | 8/2002 | Ando |
| 6,472,288 | B2 | 10/2002 | Freeman et al. |
| 6,552,373 | B2 | 4/2003 | Ando et al. |
| 6,624,452 | B2 | 9/2003 | Yu et al. |
| 6,670,653 | B1 | 11/2003 | Micovic et al. |
| 6,661,037 | B2 | 12/2003 | Pan et al. |
| 6,727,531 | B1 | 4/2004 | Redwing et al. |
| 6,849,864 | B2 | 2/2005 | Nagahama et al. |
| 6,936,871 | B2 | 8/2005 | Hase |
| 6,989,553 | B2 | 1/2006 | Yokogawa et al. |
| 7,470,941 | B2 | 12/2008 | Micovic et al. |
| 7,576,409 | B1 | 8/2009 | Chen et al. |
| 7,598,131 | B1 | 10/2009 | Micovic et al. |
| 7,655,529 | B1 | 2/2010 | Chen et al. |
| 8,216,910 | B2 | 7/2012 | Chen et al. |
| 8,697,532 | B2 | 4/2014 | Chen et al. |
| 9,530,708 | B1 | 12/2016 | Sharifi et al. |
| 2001/0017370 | A1 | 8/2001 | Sheppard et al. |
| 2002/0066909 | A1 | 6/2002 | Tanomura et al. |
| 2002/0070389 | A1 | 6/2002 | Song |
| 2002/0100412 | A1 | 8/2002 | Hirayama et al. |
| 2002/0153534 | A1* | 10/2002 | Mochizuki ......... H01L 27/0277 257/173 |
| 2002/0167023 | A1 | 11/2002 | Chavarkar et al. |
| 2003/0121468 | A1 | 7/2003 | Boone et al. |
| 2003/0140317 | A1 | 7/2003 | Brewer et al. |
| 2004/0036082 | A1 | 2/2004 | Bahl et al. |
| 2004/0036083 | A1 | 2/2004 | Kakeda |
| 2004/0175895 | A1 | 9/2004 | Behammer |
| 2004/0188711 | A1 | 9/2004 | Coolbaugh et al. |
| 2005/0087751 | A1 | 4/2005 | Nakamura et al. |
| 2010/0059793 | A1 | 3/2010 | Chen et al. |

FOREIGN PATENT DOCUMENTS

| | | |
|---|---|---|
| EP | 607936 | 7/1994 |
| JP | 58-114455 | 7/1983 |
| JP | 03-108725 | 5/1991 |
| JP | 03-289135 | 12/1991 |
| JP | 05-175438 | 7/1993 |
| JP | 05-206155 | 8/1993 |
| JP | 05-304165 | 11/1993 |
| JP | 715357 | 6/1996 |
| JP | 10-294452 | 11/1998 |
| JP | 11-243251 | 9/1999 |
| JP | 11-274474 | 10/1999 |
| JP | 2000-68498 | 3/2000 |
| JP | 2000-223697 | 8/2000 |
| JP | 2001-274375 | 10/2001 |
| WO | 2000/079600 | 12/2000 |

OTHER PUBLICATIONS

Agarwal, et al., "A 277-Ghz $f_{max}$ Transferred-Substrate Heterojunction Bipolar Transistor," IEEE Electron Device Letters, vol. 18, No. 5, pp. 228-231 (May 1997).

Bhat, et al., "InP/GaAsSb/InP and InP/GaAsSb/InGaAsP double heterojunction bipolar transistors with a carbon-doped base grown by organometallic chemical vapor deposition," Appl. Phys. Lett., vol. 68 (7), pp. 985-987 (Feb. 1996).

Bolognesi et al, "Non-blocking collector InP/GaAs$_{0.51}$Sb$_{0.49}$/InP double heterojunction bipolar transistors with a staggered lined up base-collector junction", IEEE Electron Device Letters, vol. 20, No. 4, Apr. 1999, pp. 155-157.

Chen et al., "Heterojunction Bipolar Transistors with Emitter Barrier Lowered by Delta-Doping" IEEE Electron Device Letters, US, IEE Inc. New York, vol. 15, No. 8. Aug. 1, 1994, pp. 286-288.

Freeman et al, "Device scaling and application trends for over 200 GHz SiGe HBTs", 2003 IEEE, pp. 6-9.

Guden et al., "Material Parameters of Quaternary III-V Semiconductors for Multilayer Mirrors at 1.55 µm Wavelength." Modeling and Simulation in Materials Science and Engineering, GB, IOP Publishing, Bristol. vol. 4, No. 4, Jul. 1, 1996, pp. 349-357.

Kroemer, "Heterostructure Bipolar Transistors and Integrated Circuits," Proceedings of the IEEE, vol. 70, No. 1, pp. 13-25 (Jan. 1982).

Liu, "Handbook of III-V Heterojunction Bipolar Transistors" John Wiley & Sons, pp. 249-252, 531-541, 1168-1171, 1217 (Mar. 1998).

McDermott, et al., "Growth and doping of GaAsSb via metalorganic chemical vapor deposition for InP heterojunction bipolar transistors," Appl. Phys. Lett., vol. 68 (10), pp. 1386-1388 (Mar. 1996).

Nadella et al., "MeV Energy Ion Implantation and its Device Applications in InP," International Conference on InP and Related Materials, pp. 353-356 (1993).

Nguyen et al., "AlInAs/GaInAs/InP Double Heterojunction Bipolar Transistor with a Novel Base-Collector Design for Power Applications." IEEE Electron Device Letters, vol. 17, No. 3, pp. 133-135 (Mar. 1996).

Pearton et al., "Implant-Induced High-Resistivity Regions in InP and InGaAs." J. Appl. Phys., vol. 66, No. 2, pp. 656-662 (Jul. 15, 1989).

Sato et al., "High Current Density Emitter-Down InGaAlAs Heterojunction Bipolar Transistors," IEEE Transactions on Electron Devices, vol. 36, No. 11, p. 2601 (Nov. 1989).

Shibata et al., "Stencil Mask Ion Implantation Technology," IEEE Transactions on Semiconductor Manufacturing, vol. 15, No. 2, pp. 183-188 (May 2002).

Sokolich et al., "InP HBT Integrated Circuit Technology with Selectively Implanted Subcollector and Regrown Device Layers," GaAs Symposium, pp. 212-222 (2003).

Tseng et al., "High-Performance, Graded-Base AlGaAs/InGaAs Collector-Up Heterojunction Bipolar Transistors Using a Novel Selective Area Regrowth Process," IEEE Electron Device Letters, vol. 20, No. 6, pp. 271-273 (Jun. 1999).

Yamahata et al., "InP/InGaAs Collector-Up Heterojunction Bipolar Transistors Fabricated Using Fe-Ion-Implementation," 7th IPRM, pp. 652-655 (1995).

From PCT/US00/17156 International Search Report and Written Opinion dated Aug. 29, 2000.

(56) References Cited

OTHER PUBLICATIONS

From PCT/US00/17156, International Preliminary Report on Patentability (IPRP) dated Sep. 25, 2001.
From U.S. Appl. No. 10/313,374 (now U.S. Pat. No. 7,470,941), Final Office Action dated Apr. 20, 2006.
From U.S. Appl. No. 10/313,374 (now U.S. Pat. No. 7,470,941), Non Final Office Action dated Feb. 28, 2005.
From U.S. Appl. No. 10/313,374 (now U.S. Pat. No. 7,470,941), Non Final Office Action dated Jan. 19, 2007.
From U.S. Appl. No. 10/313,374 (now U.S. Pat. No. 7,470,941), Non Final Office Action dated Jun. 4, 2004.
From U.S. Appl. No. 10/313,374 (now U.S. Pat. No. 7,470,941), Non Final Office Action dated Sep. 21, 2005.
From U.S. Appl. No. 10/313,374 (now U.S. Pat. No. 7,470,941), Non Final Office Action dated Sep. 25, 2007.
From U.S. Appl. No. 10/313,374 (now U.S. Pat. No. 7,470,941), Notice of Allowance dated Sep. 26, 2008.
From U.S. Appl. No. 10/313,374 (now U.S. Pat. No. 7,470,941), Restriction dated Mar. 19, 2004.
From U.S. Appl. No. 11/052,935 (now U.S. Pat. No. 7,655,529), Advisory Action dated Dec. 12, 2007.
From U.S. Appl. No. 11/052,935 (now U.S. Pat. No. 7,655,529), Final Office Action dated Aug. 24, 2007.
From U.S. Appl. No. 11/052,935 (now U.S. Pat. No. 7,655,529), Final Office Action dated Oct. 17, 2008.
From U.S. Appl. No. 11/052,935 (now U.S. Pat. No. 7,655,529), Non Final Office Action dated Apr. 15, 2009.
From U.S. Appl. No. 11/052,935 (now U.S. Pat. No. 7,655,529), Non Final Office Action dated Apr. 2, 2008.
From U.S. Appl. No. 11/052,935 (now U.S. Pat. No. 7,655,529), Non Final Office Action dated Mar. 6, 2007.
From U.S. Appl. No. 11/052,935 (now U.S. Pat. No. 7,655,529), Notice of Allowance dated Oct. 5, 2009.
From U.S. Appl. No. 11/052,935 (now U.S. Pat. No. 7,655,529), Restriction Requirement dated Oct. 19, 2006.
From U.S. Appl. No. 11/202,001 (now U.S. Pat. No. 7,576,409), Final Office Action dated Jan. 22, 2009.
From U.S. Appl. No. 11/202,001 (now U.S. Pat. No. 7,576,409), Non Final Office Action dated May 6, 2008.
From U.S. Appl. No. 11/202,001 (now U.S. Pat. No. 7,576,409), Notice of Allowance dated Apr. 8, 2009.
From U.S. Appl. No. 11/202,001 (now U.S. Pat. No. 7,576,409), Restriction dated Jan. 2, 2008.
From U.S. Appl. No. 11/202,001 (now U.S. Pat. No. 7,576,409), Restriction dated Sep. 17, 2007.
From U.S. Appl. No. 12/290,921 (now U.S. Pat. No. 7,598,131), Notice of Allowance dated Jun. 16, 2009.
From U.S. Appl. No. 12/616,374 (now U.S. Pat. No. 8,697,532), Advisory Action dated Aug. 16, 2011.
From U.S. Appl. No. 12/616,374 (now U.S. Pat. No. 8,697,532), Advisory Action dated May 14, 2013.
From U.S. Appl. No. 12/616,374 (now U.S. Pat. No. 8,697,532), Final Office Action dated Jun. 10, 2011.
From U.S. Appl. No. 12/616,374 (now U.S. Pat. No. 8,697,532), Final Office Action dated Mar. 18, 2013.
From U.S. Appl. No. 12/616,374 (now U.S. Pat. No. 8,697,532), Final Office Action dated Sep. 16, 2013.
From U.S. Appl. No. 12/616,374 (now U.S. Pat. No. 8,697,532), Non Final Office Action dated Jan. 12, 2011.
From U.S. Appl. No. 12/616,374 (now U.S. Pat. No. 8,697,532), Non Final Office Action dated Sep. 18, 2012.
From U.S. Appl. No. 12/616,374 (now U.S. Pat. No. 8,697,532), Notice of Allowance dated Nov. 26, 2013.
From U.S. Appl. No. 12/616,374 (now U.S. Pat. No. 8,697,532), Restriction Requirement dated Nov. 10, 2010.
From U.S. Appl. No. 13/909,750 (now U.S. Pat. No. 9,530,708), Final Office Action dated Mar. 9, 2016.
From U.S. Appl. No. 13/909,750 (now U.S. Pat. No. 9,530,708), Non Final Office Action dated Sep. 9, 2015.
From U.S. Appl. No. 13/909,750 (now U.S. Pat. No. 9,530,708), Notice of Allowance dated Aug. 23, 2016.
From U.S. Appl. No. 13/909,750 (now U.S. Pat. No. 9,530,708), Restriction Requirement dated Jun. 3, 2015.
From U.S. Appl. No. 09/364,730 (now U.S. Pat. No. 6,670,653), Restriction Requirement dated Apr. 5, 2001.
From U.S. Appl. No. 09/364,730 (now U.S. Pat. No. 6,670,653), Non Final Office Action dated Jun. 21, 2001.
From U.S. Appl. No. 09/364,730 (now U.S. Pat. No. 6,670,653), Final Office Action dated Dec. 13, 2001.
From U.S. Appl. No. 09/364,730 (now U.S. Pat. No. 6,670,653), Non Final Office Action dated Jun. 30, 2002.
From U.S. Appl. No. 09/364,730 (now U.S. Pat. No. 6,670,653), Non Final Office Action dated Aug. 14, 2002.
From U.S. Appl. No. 09/364,730 (now U.S. Pat. No. 6,670,653), Final Office Action dated Feb. 14, 2003.
From U.S. Appl. No. 09/364,730 (now U.S. Pat. No. 6,670,653), Notice of Allowance dated Jul. 1, 2003.
From U.S. Appl. No. 12/478,628 (now U.S. Pat. No. 8,216,910), Non Final Office Action dated Sep. 21, 2011.
From U.S. Appl. No. 12/478,628 (now U.S. Pat. No. 8,216,910), Notice of Allowance dated Dec. 23, 2011.
From U.S. Appl. No. 09/338,217 (unpublished), Restriction Requirement dated Feb. 7, 2001.
From U.S. Appl. No. 09/338,217 (unpublished), Non Final Office Action dated May 4, 2001.
From PCT/US00/20456 International Search Report and Written Opinion dated Nov. 9, 2000.
From PCT/US00/20456, International Preliminary Report on Patentability (IPRP) dated Sep. 19, 2002.
R. Reuss, et al "Large-Area, Flexible Macroelectronics," Proc. IEEE, vol. 93, No. 7, pp. 1239-1256, 2005.
Misra, V., "Emerging technologies—flexible electronics," Electron Devices Meeting, pp. 437-437, 2005.
Kim, D., Moon, J., "Highly Conductive Ink Jet Printed Films for Nanosilver Particles for Printable Electronics" Electrochemical and Solid-State Letters, vol. 8, pp. 30-34, Sep. 2008.
Y. Sun, J.A. Rogers, "Inorganic Semiconductors for Flexible Electronics", Advanced Materials, vol. 19, pp. 1897-1916, 2007.
J. Ahn, H.S. Kim, K.J. Lee, Z. Zhu, E. Menard, R.G.Nuzzo, and A. Rogers, "High-Speed Mechanically Flexible Single-Crystal Silicon Thin-Film Transistors on Plastic Substrates", IEEE Electron Device Letters, vol. 27, No. 6, pp. 460-462, 2006.
I-I.e. Yuan and Z. Ma, "Microwave thin-film transistors using Si nanomembranes on flexible polymer substrate", Applied Physics Letters, vol. 89, pp. 212105, 2006.
H.C. Yuan, G.K. Celler, and Z. Ma, "7.8-GHz flexible thin-film transistors on a low-temperature plastic substrate", Journal ofApplied Physics, vol. 102, p. 034501, 2007.
Z. Ma, and L. Sun, "Will Future RFIC Be Flexible?," IEEE Wireless and Microwave Tech. Conf. pp. 1-5, Apr. 2009.
Lei Sun, Guoxuan Qin, Jung-Hun Seo, George K. Celler, Weidong Zhou, and Zhengiang Ma, "12-GHz Thin-Film Transistors on Transferrable Silicon Nanomembranes for High-Performance Flexible Electronics", Small-journal, vol. 6, No. 22, pp. 2553-2557, 2010.

\* cited by examiner

FLEXIBLE ELECTRONIC CIRCUIT AND METHOD FOR MANUFACTURING SAME

CROSS REFERENCE TO RELATED APPLICATIONS

This application claims the benefit of and is a divisional of U.S. patent application Ser. No. 13/906,750 filed on May 31, 2013, the disclosure of which is incorporated herein by reference.

The present disclosure relates to U.S. Pat. No. 7,598,131 "High power-low noise microwave GaN heterojunction field effect transistor"; US2010059793 "InP BASED HETEROJUNCTION BIPOLAR TRANSISTORS WITH EMITTER-UP AND EMITTER-DOWN PROFILES ON A COMMON WAFER"; U.S. Pat. No. 6,670,653 "INP COLLECTOR INGAASSB BASE DHBT DEVICE AND METHOD OF FORMING THE SAME"; and WO0079600 "SINGLE HETEROJUNCTION InP-COLLECTOR BJT DEVICE AND METHOD"; which are hereby incorporated by reference.

TECHNICAL FIELD

The present disclosure relates to flexible electronic circuits; in particular flexible high frequency electronic circuits.

BACKGROUND

Flexible/printable electronics have received a great attention in the past decade mainly at low frequency below MHz ranges for consumer electronics such as displays, portable devices and RFIDs [see for example R. Reuss, et al "Large-Area, Flexible Macroelectronics," Proc. IEEE, vol. 93, no. 7, pp. 1239-1256, 2005; Misra, V., "Emerging technologies in flexible electronics," Electron Devices Meeting, pp. 437-437, 2005; or Kim, D., Moon, J., "Highly Conductive Ink Jet Printed Films for Nanosilver Particles for Printable Electronics" Electrochemical and Solid-State Letters, Vol. 8, pp. 30-34, September 2008].

The main drives for the technology include low-cost manufacturing through roll-to-roll process, lightweight, mechanical reliability, and bendable for irregular surfaces. Flexible/printable electronic technology is a key enabler for many demanding electronic systems which have constraint requirement such as space, weight and power (SWaP) in addition to being low-cost. Conformal next generation phased array radar based on flexible electronics is an example for defense applications. High quality passive components can be easily fabricated on a flexible substrate; however, active devices are not easy to integrate.

Thin film transistor technology (TFT) based on amorphous silicon and low-temperature polysilicon semiconductor materials deposited on a flexible substrate have shown great promises for the technology at low frequency applications. Transparent oxide film such as ZnO has also been studied to fabricate TFT but still showing low cut of frequency (fT) [see for example Y. Sun, J. A. Rogers, "Inorganic Semiconductors for Flexible Electronics", Advanced Materials, vol. 19, pp. 1897-1916, 2007].

The foregoing active materials used in the flexible electronics suffer mainly from low carrier mobility due to non-single crystal epitaxial layer. Hence, they are not suitable for microwave and millimeter-wave applications. An Alternative approach such as assembling and transferring of single-crystalline nanostructures for example silicon nanowires on a flexible substrate have been investigated for RF and higher frequency ranges since they show transport properties better than a-Si or polysilicon. The drawback of these types of active devices is their low level of output current handling in addition to low cut off frequency for high performance applications.

TFT type GaAs MESFET was proposed in order to achieve higher cut off frequency reported fT of 1.55 GHz for 2 μm gate length [see for example J. Ahn, H. S. Kim, K. J. Lee, Z. Zhu, E. Menard, R. G. Nuzzo, and A. Rogers, "*High-Speed Mechanically Flexible Single-Crystal Silicon Thin-Film Transistors on Plastic Substrates*", IEEE Electron Device Letters, vol. 27, no. 6, pp. 460-462, 2006].

Recent work based-on transformable single-crystal silicon nanomembrane on SOI substrate to a flexible substrate has shown fT of 1.9 GHz for a 4 μm gate length [see for example I-I.e. Yuan and Z. Ma, "*Microwave thin-film transistors using Si nanomembranes on flexible polymer substrate*", Applied Physics Letters, vol. 89, pp. 212105, 2006; or H. C. Yuan, G. K. Celler, and Z. Ma, "*7.8-GHz flexible thin-film transistors on a low-temperature plastic substrate*", Journal of Applied Physics, vol. 102, p. 034501, 2007; or Z. Ma, and L. Sun, "*Will Future RFIC Be Flexible?,*" IEEE Wireless and Microwave Tech. Conf. pp. 1-5, April 2009; or Lei Sun, Guoxuan Qin, Jung-Hun Seo, George K. Celler, Weidong Zhou, and Zhenqiang Ma, "12-GHz Thin-Film Transistors on Transferrable Silicon Nanomembranes for High-Performance Flexible Electronics", Small-journal, vol. 6, no. 22, pp. 2553-2557, 2010].

However, there still exists a need for cheap, easy to manufacture flexible chips; in particular flexible chip that perform satisfactorily at high frequency.

SUMMARY

An embodiment of the present disclosure relates to an electronic circuit comprising: an integrated circuit chip, the integrated circuit chip having a top face; portions of the top face of the chip being covered by a first metal layer electrically connected to the integrated circuit; and a dialectic layer formed on the top face of the chip beside and on top of said first metal layer; wherein the dielectric layer extends parallel to the top face of the chip beyond the edges of the chip, the first metal layer extending in the dielectric layer beyond the edges of the chip; and wherein portions of a top surface of the dielectric layer are covered by a second metal layer, portions of the first and second metal layers being electrically connected through the dielectric layer. According to an embodiment of the disclosure, the dielectric layer and the first and second metal layers form a flexible layer, which can be rolled or conformed to a shape.

According to an embodiment of the present disclosure, the bulk of the integrated circuit chip is a semiconductor epitaxial layer.

According to an embodiment of the present disclosure, the integrated circuit chip comprises an integrated circuit formed in a semiconductor epitaxial layer, the epitaxial layer having been formed on a substrate; the first metal layer and the dielectric layer having been formed on the top face of the epitaxial layer; and the substrate has been etched away from the bottom of the epitaxial layer and the epitaxial layer has been etched away from the bottom of the dielectric layer, except in the vicinity of said integrated circuit.

According to an embodiment of the present disclosure, the electronic circuit comprises a third metal layer on the bottom face of the integrated circuit chip.

According to an embodiment of the present disclosure, at least a portion of the third metal layer is connected to at least a portion of the first metal layer.

According to an embodiment of the present disclosure, the integrated circuit chip comprises at least one signal-carrying conductor not electrically connected to the third metal layer; and the third metal layer is arranged to not overlap said at least one signal-carrying conductor.

According to an embodiment of the present disclosure, a portion of one of the first and second metal layers forms a signal-carrying conductor having a given shape; and a substantially identically shaped conductor, formed in the other of the one of the first and second metal layers, is connected to the ground.

According to an embodiment of the present disclosure, the integrated circuit is a high frequency active circuit and a portion of one of the first and second metal layers forms a passive component of a high frequency circuit.

An embodiment of the present disclosure comprises a circuit assembly with: a substrate having a surface; electronic passive elements and conductors formed on said substrate surface; and an electronic circuit as detailed hereabove attached to said substrate surface such that one of the first and second metal layers is electrically coupled to said conductors formed on said substrate surface.

An embodiment of the present disclosure comprises a method for manufacturing an electronic circuit; the method comprising:

a/ forming up to the penultimate top metal layer of an IC chip on a semiconductor substrate;
b/ covering the IC chip with a layer of dielectric;
c/ forming on top of the dielectric layer the ultimate top metal layer of the IC chip, wherein portions of the penultimate top metal layer and top metal layer are electrically connected through the dielectric layer;
d/ attaching the dielectric's top surface on a handle support; flipping the IC chip and etching back the substrate of the chip until only the portions of the substrate located around the components of the IC chip are left at the bottom surface of the dielectric layer; and
e/ separating the dielectric's top surface from the handle support.

According to an embodiment of the present disclosure, said IC chip comprises an integrated circuit formed in a semiconductor epitaxial layer grown on said substrate; said etching back the substrate of the chip until only the portions of the substrate located around the components of the IC chip are left at the bottom surface of the dielectric layer comprising etching back the substrate up to the bottom surface of the epitaxial layer.

According to an embodiment of the present disclosure, the method further comprises forming a third metal layer on the bottom surface of the chip after etching back the substrate of the chip.

According to an embodiment of the present disclosure, forming a third metal layer on the bottom surface of the chip comprises forming connections between at least a portion of the third metal layer and at least a portion of the first metal layer.

According to an embodiment of the present disclosure, forming a third metal layer on the bottom surface of the chip comprises forming the third metal layer such that it does not overlap at least one signal-carrying conductor of the integrated circuit chip.

According to an embodiment of the present disclosure, forming the first and second metal layers comprise:

forming a portion of one of the first and second metal layer into a signal-carrying conductor having a given shape; and forming in the other of the one of the first and second metal layer a substantially identically shaped conductor connected to the ground.

According to an embodiment of the present disclosure, forming the IC chip comprises forming a high frequency IC chip and wherein forming the first and second metal layers comprise forming a passive component of a high frequency circuit with a portion of one of the first and second metal layers.

An embodiment of the present disclosure relates to a method of forming a circuit assembly comprising:

forming electronic passive elements and conductors on a surface of a substrate;
forming an electronic circuit according to the method detailed hereabove; and
attaching said electronic circuit to said substrate surface such that one of the first and second metal layers is electrically coupled to said conductors formed on said substrate surface.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1A:
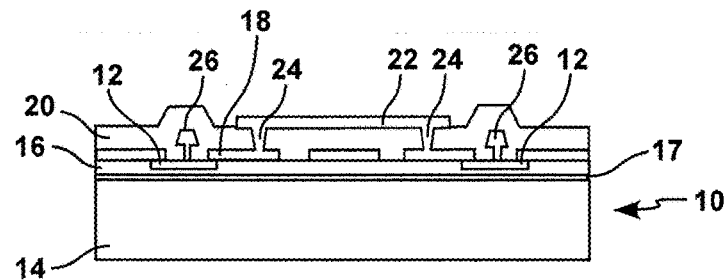
FIGS. 1A to 1E illustrate manufacturing steps of a flexible electronic circuit according to the present disclosure.

FIG. 1A shows an IC chip 10 comprising at least one active circuit 12 formed in a substrate 14. According to an embodiment of the present disclosure, active circuit 12 is formed in an epitaxial layer 16 formed at the surface of substrate 14. An etch stop layer 17 can be provided between the epitaxial layer 16 and the substrate 14. According to an embodiment of the present disclosure, an active circuit 12 having predetermined operating performances is formed, until the penultimate top layer 18 of metal of active circuit 12, using a known manufacturing process suitable for manufacturing on a substrate a non-flexible active circuit having substantially the same predetermined operating performances.

According to an embodiment of the present disclosure, a layer of flexible dielectric 20 is formed on top of the penultimate metal layer 18. The top metal layer 22 of active circuit 12 is formed on top of dielectric layer 20. Portions of top metal layer 22 can be connected to portions of the penultimate metal layer 18 with vias 24. As shown in FIG.

1A, conductors 26 can optionally be formed in the thickness of dielectric layer 20 in contact of top metal layer 22 or penultimate metal layer 18, for example using a trench filled with via material.

According to an embodiment of the present invention, the layer of flexible dielectric 20 comprises polymide. However, the dielectric 20 can also comprise Liquid Crystal Polymer (LCP), Polyethylene Terephthalate (PET), polyethylene naphthalate (PEN); or the materials known by the commercial names of Mylar™ Kapton™ Parylene™, Dupont Pyralux™. Similarly, the metal layers 18, 22 can be gold, aluminum, copper, or any metal suitable for the manufacturing of an integrated circuit. According to an embodiment of the present invention, the two top layers of the active circuit 12 are separated by a layer of flexible dielectric. However, alternatively, three or more top layers of the active circuit 12 can be separated by layers of flexible dielectric to form a flexible layer if appropriate.

According to an embodiment of the present disclosure, active circuit 12 can be a high frequency circuit that comprises at least a InP High Electron Mobility Transistor (HEMT)/Metamorphic High Electron Mobility Transistor MHEMT, and substrate 14 is a InP or GaAs substrate. According to embodiments of the present disclosure, circuit 12 can be manufactured as disclosed in for example U.S. Pat. No. 7,598,131 "High power-low noise microwave GaN heterojunction field effect transistor"; or US2010059793 "InP BASED HETEROJUNCTION BIPOLAR TRANSISTORS WITH EMITTER-UP AND EMITTER-DOWN PROFILES ON A COMMON WAFER"; or U.S. Pat. No. 6,670,653 "INP COLLECTOR INGAASSB BASE DHBT DEVICE AND METHOD OF FORMING THE SAME"; or WO0079600 "SINGLE HETEROJUNCTION InP-COLLECTOR BJT DEVICE AND METHOD", but for the replacement of the layer between the two top metal layers by a dielectric layer 20 and the subsequent processing detailed hereafter.

According to an embodiment of the present disclosure, manufacturing active circuit 12 using a known manufacturing process suitable for manufacturing high frequency circuits on a regular substrate (with the exception of replacing the last dielectric layer between the top metal layers by flexible dielectric layer 20 and subsequent processing detailed hereafter), causes active circuit 12 to have satisfactory high frequency operating performances.

Figure 1B:
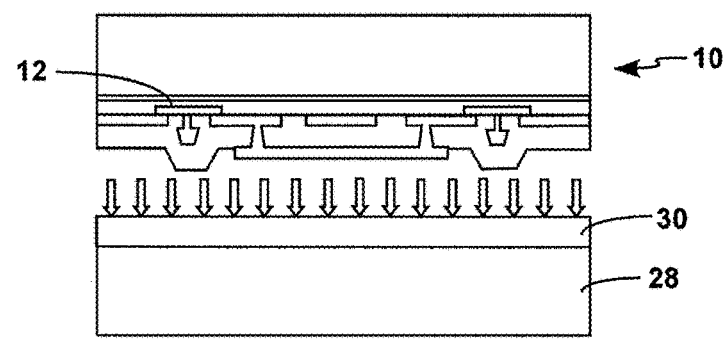

FIG. 1B shows IC chip 10 having been flipped and the top surface of IC chip 10 being attached to a handle support 28 using a layer of temporary adhesive 30 such as high temperature wax or the adhesive known under the commercial name CR-200™ from Brewer Science or EP29™ from MasterBond.

Figure 1C:
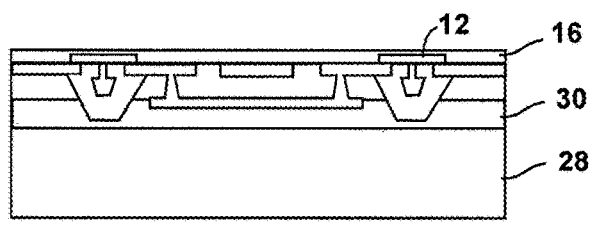

FIG. 1C shows the bottom of the substrate 14 having been etched away down to the vicinity of active circuit 12. Where active circuit 12 was formed in an epitaxial layer 16, substrate 14 can be etched away down to the etch stop layer 17 separating epitaxial layer 16 from substrate 14. According to an embodiment of the present disclosure, HCL wet etch process at room temperature with 10 micrometer/min etch rate can be used to etch a InP substrate with a InGaAs etch stop layer. According to an embodiment of the present disclosure, a GaAs substrate can be etched/removed using either Ammonium Hydroxide solution with ~2 micrometer/min etch rate or a dry etch Chlorine-based chemistry with ~10 micrometer/min etch rate at room temperature.

Figure 1D:
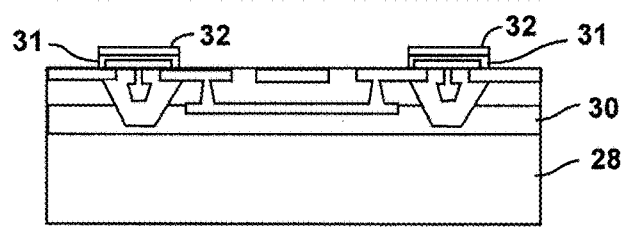

FIG. 1D shows the bottom of the substrate 14 having been further etched away, down to the bottom surface of dielectric 20, except around active circuit or component 12, thus forming a chip 31 of substrate 14 around active circuit 12. In the embodiment where active circuit 12 is formed in an epitaxial layer 16, epitaxial layer 16 is etched away down to the bottom surface of dielectric 20 except around active circuit 12, thus forming a chip 31 of epitaxial layer 16 around active circuit 12. According to an embodiment of the present disclosure, the thickness of chip 31 can be of 0.5 micrometer. The thickness of the chip can generally be from 0.1 micron to 600 microns. According to an embodiment of the present disclosure, after etching the substrate/epitaxial layer down to the bottom surface of dielectric 20 except around chip 31, a layer of metal 32 can be formed on the bottom surface of chip 31. The layer of metal 32 can be used to ease removing heat from the active circuit 12 in operation. According to an embodiment of the present disclosure, the layer of metal 32 can be coupled to conductors inside active circuit 12, or to metal layer 18, through or on the side of chip 31.

According to an embodiment of the present disclosure, the active circuit 12 comprises at least one signal-carrying conductor (not shown) that is not electrically connected to metal layer 32, and metal layer 32 is patterned to not overlap said signal-carrying conductor. This allows reducing capacitive coupling between the signal-carrying conductor and metal layer 32.

Figure 1E:
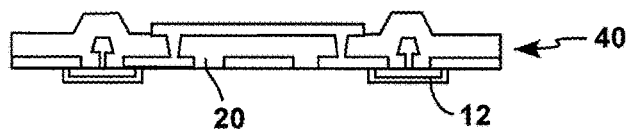

FIG. 1E shows a completed electronic circuit 40 according to an embodiment of the present disclosure, after handle support 28 was detached from the top surface of dielectric layer 20 by removing temporary adhesive 30. According to an embodiment of the present disclosure, electronic circuit 40 forms a flexible, conformable circuit where in particular the portions of the dielectric layer 20 and metal layers 18 and 22 extending beyond the edges of chip 31 are very thin and flexible and can be bent along a large range of angles including 0 to 350 degrees. It is noted that the portion of the electronic circuit 40 to which chip 31 is attached is also rather flexible due to the small size and thinness of chip 31, such that electronic circuit 40 is generally rollable. As detailed hereafter, according to an embodiment of the disclosure, flexible circuit 40 can be "printable", or attachable to a flexible substrate on which for example passive elements have been formed or attached.

According to an embodiment of the present disclosure, the thickness of the dielectric layer 20 is of 3 microns, but it can be comprised between 0.5 microns to 500 microns. The circuit 40 illustrated hereabove comprises two chips 31, but it can comprise one chip 31 only, or more than two chips 31. The chips 31 described hereabove comprise a single active circuit or component 12, but they can also comprise one or more passive circuits or components and/or one or more active circuits or components. According to an embodiment of the present invention, passive circuits can comprise TaN or epitaxial resistors. According to an embodiment of the present invention, a circuit 40 can comprise one or more chips 31 having one or more active circuits and one or more chips 31 having one or more passive circuits. It is for example contemplated that a circuit according to an embodiment of the present disclosure can be a conformal phased array radar. It is noted that, even though FIGS. 1A-1E relate to an electronic circuit made using a technology for making InP HEMT/MHEMT on a InP or GaAs substrate, the present disclosure also contemplates using technologies for making InP HST, or using SOI silicon or GaN substrates.

According to an embodiment of the disclosure, manufacturing chip 31 using a known technology, except for the formation of dielectric layer 20 between the two top metal layers of chip 31, followed by an etching of the substrate/epitaxial layer down to the bottom surface of dielectric 20 except around chip 31, allows manufacturing a electronic circuit that is flexible and that also comprises a chip 31 operating substantially as would the same chip 31 if it were manufactured entirely using said known technology. Importantly, an electronic circuit according to the present disclosure distinguishes from a known chip manufactured alone, and then assembled on a flexible substrate, at least in that the chip according to the present disclosure can be smaller and thinner; does not require contact pads that would be required for the known chip to be assemblable (and would detrimentally affect the operation of the known chip); and does not require the alignment for assembling the known chip on the flexible substrate. Similarly, the flexible dielectric layer 20 having metal layer conductors 18, 22 of an electronic circuit according to the present disclosure distinguishes from a known flexible substrate attached to a chip manufactured alone at least in that the dielectric layer according to the present disclosure can be smaller and thinner; does not require contact pads that would be required for assembly to the known chip (and would detrimentally affect the operation of the known chip); and does not require the alignment for assembling the known chip on the flexible substrate.

Figure 2:
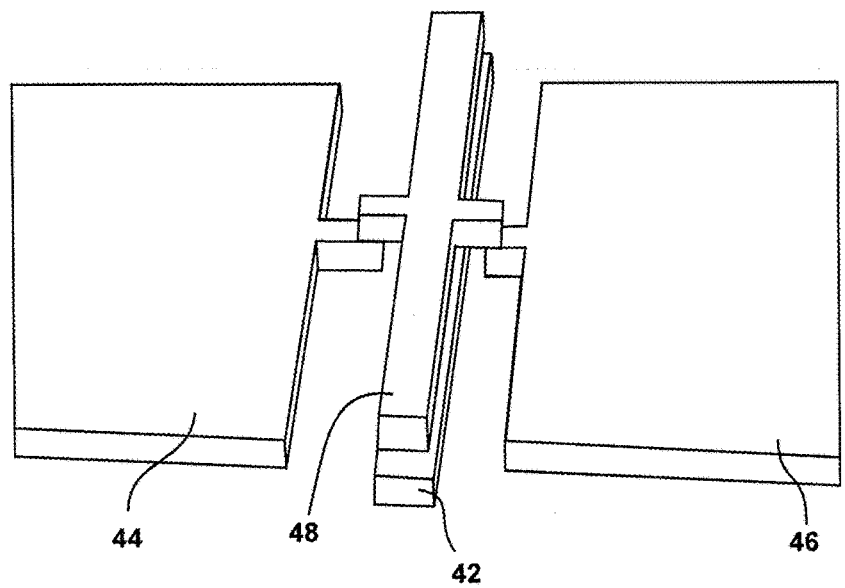
FIG. 2 illustrates a portion of a signal line according to an embodiment of the present disclosure.

FIG. 2 illustrates a portion of a signal line 42 according to an embodiment of the present disclosure. Signal line 42 is for example formed in metal layer 18 between two conductor portions 44, 46 of metal layer 18 connected to the ground. According to an embodiment of the present disclosure a ground line 48 having substantially the same shape as signal line 42 is formed in metal layer 22 above signal line 42. In the embodiment illustrated, ground line 48 is connected to ground conductors 44, 46 by vias (not shown). The inventors have noted that the above structure allows maintaining substantially constant a given impedance of the signal line (e.g. 50 Ohms) even if the distance between signal line 42 and ground conductors 44, 46 is too small for being manufactured accurately in a reliable manner.

Figure 3:
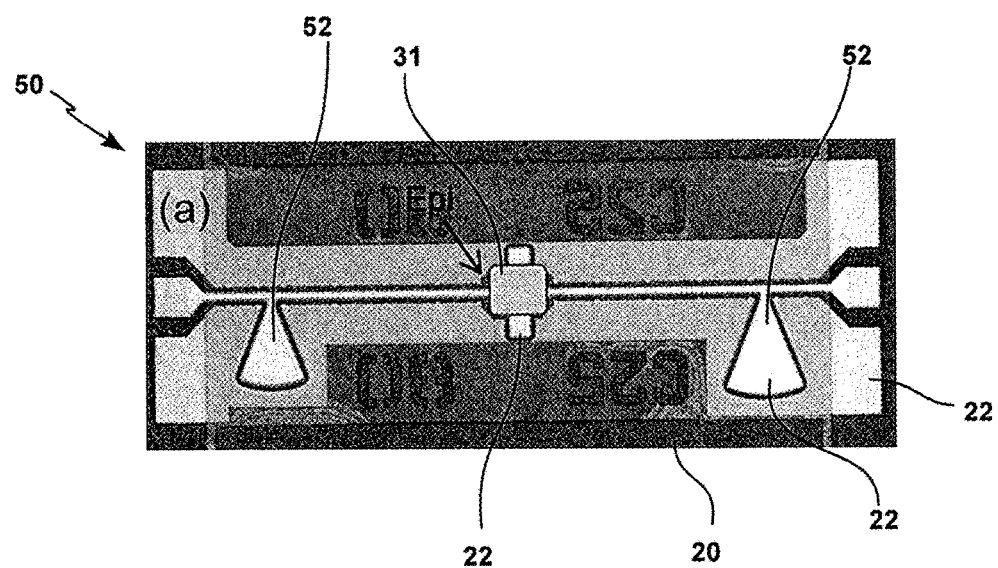
FIG. 3 illustrates an electronic circuit according to an embodiment of the present disclosure.

FIG. 3 illustrates an electronic circuit 50 according to an embodiment of the present disclosure, comprising a single chip 31 having a high frequency FET transistor, wherein the top metal layer 22 forms two microstrip radial stubs 52.

Figure 4:
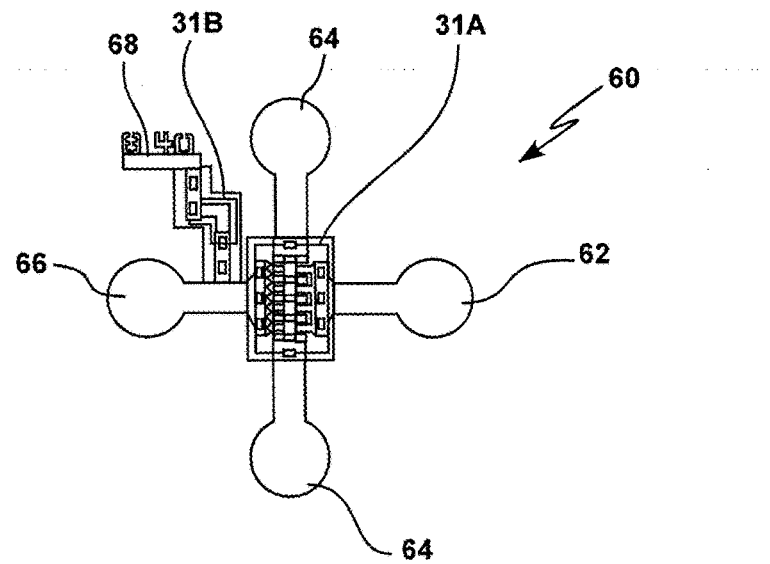
FIG. 4 illustrates an electronic circuit according to an embodiment of the present disclosure.

FIG. 4 illustrates an electronic circuit 60 according to an embodiment of the present disclosure, with a chip 31A comprising an active high frequency InP HEMT transistor and a chip 31B comprising a resistor, wherein the metal layer 22 or 18 form contact pads 62, 64, 66 and their respective connections to the Drain, Source and Gate of the HEMT of chip 31A, as well as connections from a pad 68 to chip 31B and from chip 31B to the connection to the gate of the HEMT. According to an embodiment, dielectric layer 20 can be cut to follow substantially the shape of the circuit formed by the chips 31, the pads and the connections between the pads and the chips.

Figure 5:
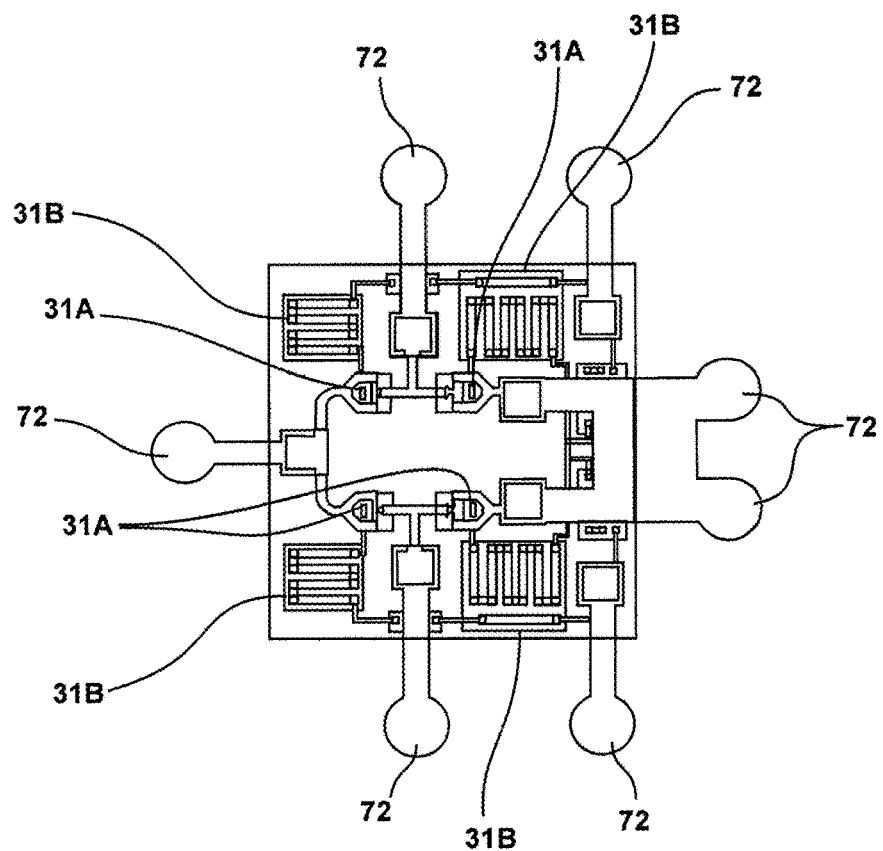
FIG. 5 illustrates an electronic circuit according to an embodiment of the present disclosure.

FIG. 5 illustrates an electronic circuit 70 according to an embodiment of the present disclosure, comprising a plurality of HEMT transistor chips 31A connected to a plurality of TaN resistor chips 31B, as well as connection pads 72.

Figure 6:
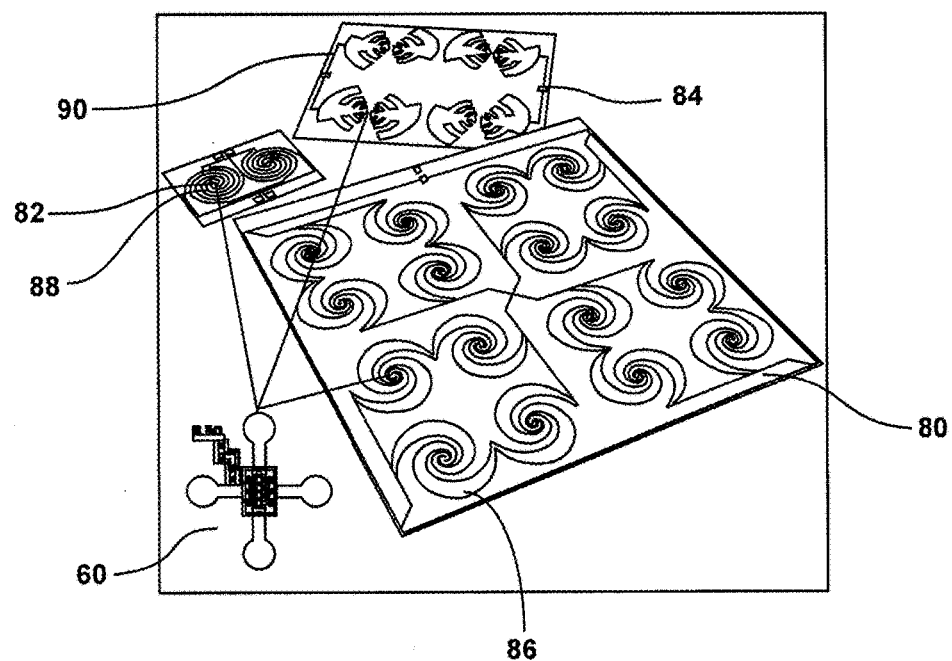
FIG. 6 illustrates circuit assemblies according to embodiments of the present disclosure.

FIG. 6 illustrates circuit assemblies according to embodiments of the present disclosure, comprising flexible substrates 80, 82, 84 on which passive elements 86, 88, 90, such as antenna, were formed. Passive elements can for example be formed by sputtering, electroplating, printing. A flexible electronic circuit according to an embodiment of the present disclosure, such as the circuit 60 illustrated in FIG. 4, is then attached to substrates 80, 82, 84, for example with adhesive, such that the pads of the circuit are connected to the appropriate passive elements 86, 88, 90. The pads can be bonded or attached with conducting adhesive.

According to an embodiment, bottom metal layer 32 can where appropriate be contacted to passive elements 86, 88, 90 to facilitate heat evacuation from the chips 31 of circuit 60.

Figure 7:
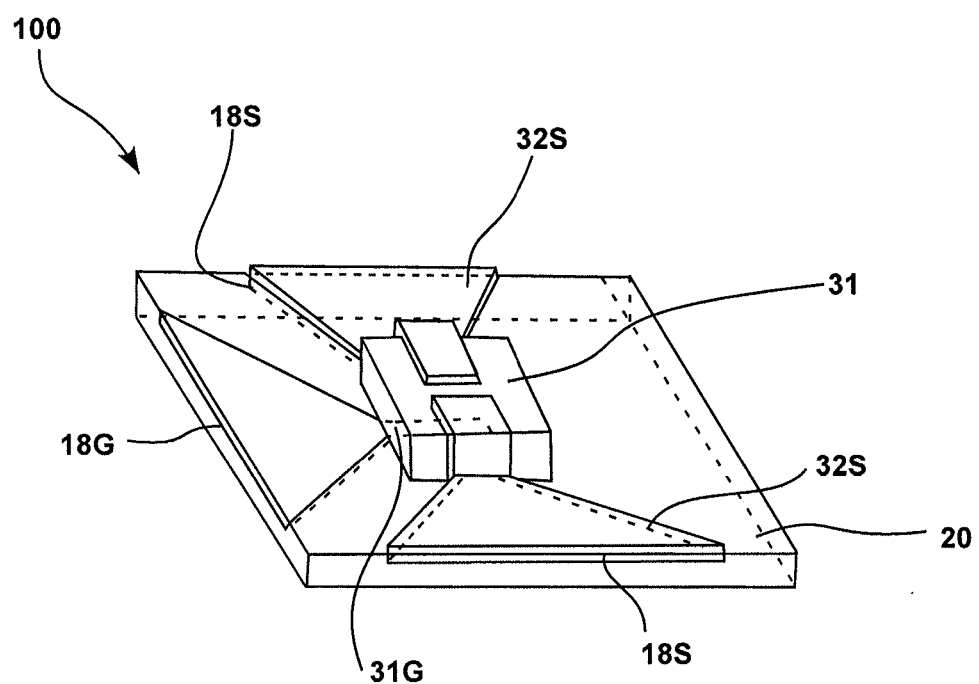
FIG. 7 illustrates an electronic circuit according to an embodiment of the present disclosure.

FIG. 7 illustrates an electronic circuit 100 according to an embodiment of the present disclosure, comprising a chip 31 having a HEMT with a gate 31G. Conductors 18S formed in metal layer 18 are connected to the source of the HEMT and a conductor 18G formed in metal layer 18 is connected to the gate 31G of the HEMT. According to an embodiment of the present disclosure, conductors 32S are formed on layer 32 on the bottom side of chip 31 and in electrical contact with conductors 18S. According to an embodiment of the present disclosure, conductors 32S are formed on layer 32 on the bottom side of chip 31 such that they do not overlap gate 31G of chip 31, so as to not couple capacitively with gate 31G. According to an embodiment of the disclosure, conductors 32S are formed in electrical contact with conductors 18S. However, layer 32 can also be formed so as not to be in contact with layer 18, for example only on the bottom side of chip 31, or on the bottom side of chip 31 and on the bottom of layer 20 but without contact to layer 18.

Applicant has made the present disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for manufacturing an electronic circuit; the method comprising:

a/ forming an integrated circuit chip on a semiconductor substrate, up to and including a penultimate top metal layer of said integrated circuit chip; said integrated circuit chip comprising at least one integrated component; the penultimate top metal layer covering a portion of the substrate above a portion of the component as well as a portion of the substrate not above a portion of the component;

b/ forming a layer of dielectric on the top face of the chip, beside and on top of said penultimate top metal layer;

c/ forming on top of the dielectric layer the ultimate top metal layer of the integrated circuit chip, wherein portions of the penultimate top metal layer and top metal layer are electrically connected through the dielectric layer;

d/ attaching the dielectric's top surface on a handle support; flipping the integrated circuit chip and etching back the substrate of the chip to expose a bottom surface of the dielectric layer and of the penultimate top metal layer around a portion of the substrate located around the components of the integrated circuit chip; and e/ separating the dielectric's top surface from the handle support.

2. The method of claim 1, comprising selecting the material and the thickness of the dielectric layer such that the dielectric layer and the penultimate and ultimate metal layers form a flexible layer that can be rolled or conformed to a shape.

3. The method of claim 1, wherein said integrated circuit chip comprises an integrated circuit formed in a semiconductor epitaxial layer grown on said substrate; said etching back the substrate of the chip until only the portions of the substrate located around the components of the IC chip are left at the bottom surface of the dielectric layer comprising etching back the substrate up to the bottom surface of the epitaxial layer.

4. The method of claim 1, further comprising forming a third metal layer on the bottom surface of the chip after etching back the substrate of the chip.

5. The method of claim 4, wherein forming a third metal layer on the bottom surface of the chip comprises forming connections between at least a portion of the third metal layer and at least a portion of said penultimate top metal layer.

6. The method of claim 4, wherein forming a third metal layer on the bottom surface of the chip comprises forming the third metal layer such that it does not overlap at least one signal-carrying conductor of the integrated circuit chip.

7. The method of claim 1, wherein forming the penultimate and ultimate top metal layers comprise:

forming a portion of one of the penultimate and ultimate top metal layer into a signal-carrying conductor having a given shape; and forming in the other of the one of the penultimate and ultimate top metal layer a substantially identically shaped conductor connected to the ground.

8. The method of claim 1, wherein forming the integrated circuit chip comprises forming a high frequency IC chip and wherein forming the first and second metal layers comprise forming a passive component of a high frequency circuit with a portion of one of the first and second metal layers.

9. A method of forming a circuit assembly comprising:

forming electronic passive elements and conductors on a surface of a substrate;

forming an electronic circuit according to claim 1; and attaching said electronic circuit to said substrate surface such that one of the first and second metal layers is electrically coupled to said conductors formed on said substrate surface.

* * * * *